US010748791B2

(12) United States Patent
Yamada et al.

(10) Patent No.: US 10,748,791 B2
(45) Date of Patent: Aug. 18, 2020

(54) CHEMICAL LIQUID TREATMENT APPARATUS AND CHEMICAL LIQUID TREATMENT METHOD

(71) Applicant: KIOXIA CORPORATION, Tokyo (JP)

(72) Inventors: Hiroaki Yamada, Yokkaichi (JP); Yoshihiro Ogawa, Yokkaichi (JP); Takeshi Hizawa, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 256 days.

(21) Appl. No.: 15/708,171

(22) Filed: Sep. 19, 2017

(65) Prior Publication Data

US 2018/0005854 A1 Jan. 4, 2018

Related U.S. Application Data

(62) Division of application No. 14/466,391, filed on Aug. 22, 2014, now Pat. No. 10,157,756.

(30) Foreign Application Priority Data

Jan. 16, 2014 (JP) ................................ 2014-005859

(51) Int. Cl.
*H01L 21/67* (2006.01)
*C23F 1/26* (2006.01)
(Continued)

(52) U.S. Cl.
CPC .......... *H01L 21/67086* (2013.01); *B08B 3/14* (2013.01); *B81C 2201/0138* (2013.01);
(Continued)

(58) Field of Classification Search
None
See application file for complete search history.

(56) References Cited

U.S. PATENT DOCUMENTS 7,659,212 B2 2/2010 Tsuchiya et al.
8,043,467 B2 10/2011 Nanba et al.
(Continued)

FOREIGN PATENT DOCUMENTS

JP 2007-266302 A 10/2007
JP 2013-74196 A 4/2013
WO WO 2005/091346 A1 9/2005

OTHER PUBLICATIONS

Office Action dated Apr. 12, 2018 in co-pending U.S. Appl. No. 14/466,391, 10 pages.

*Primary Examiner* — Sylvia Macarthur
(74) *Attorney, Agent, or Firm* — Oblon, McClelland, Maier & Neustadt, L.L.P.

(57) ABSTRACT

A chemical liquid treatment apparatus includes processing chambers; a chemical liquid feeding unit configured to cyclically feed a chemical liquid into the processing chambers; and a modifying unit. The modifying unit, when using a chemical liquid in which an effect thereof varies with a chemical liquid discharge time, is configured to calculate a variation of the effect of the chemical liquid based on the chemical liquid discharge time and is configured to modify the chemical liquid discharge time for each of the processing chambers based on the calculated variation of the effect of the chemical liquid and a cumulative time of the chemical liquid discharge time.

4 Claims, 9 Drawing Sheets

(51) Int. Cl.
*H01L 21/66* (2006.01)
*B08B 3/14* (2006.01)
*H01L 21/311* (2006.01)

(52) U.S. Cl.
CPC ........... *C23F 1/26* (2013.01); *H01L 21/31111* (2013.01); *H01L 22/10* (2013.01); *Y10T 137/0318* (2015.04)

(56) References Cited

U.S. PATENT DOCUMENTS

2002/0053402 A1* 5/2002 Nakano ............. H01L 21/67086 156/345.18
2002/0059943 A1* 5/2002 Inagaki ..................... B08B 3/08 134/18
2004/0108299 A1 6/2004 Kikuyama
2005/0067101 A1* 3/2005 Funabashi ......... H01L 21/31111 156/345.18
2005/0230045 A1 10/2005 Okuchi
2007/0277930 A1* 12/2007 Yokoyama ........ H01L 21/67051 156/345.31
2012/0091099 A1 4/2012 Kiefer
2013/0078381 A1 3/2013 Miyagi et al.
2018/0005854 A1* 1/2018 Yamada ............ H01L 21/67086

* cited by examiner

CHEMICAL LIQUID TREATMENT APPARATUS AND CHEMICAL LIQUID TREATMENT METHOD

CROSS-REFERENCE TO RELATED APPLICATION(S)

This application is a Divisional application of U.S. Ser. No. 14/466,391, filed Aug. 22, 2014, now allowed; which is based upon and claims the benefit of priority from Japanese Patent Application No. 2014-005859, filed on, Jan. 16, 2014 the entire contents of which are incorporated herein by reference.

FIELD

Embodiments disclosed herein generally relate to a chemical liquid treatment apparatus and a chemical liquid treatment method.

BACKGROUND

In chemical liquid treatment systems, variation in the effect of a chemical liquid is indicated by a function of time or duration of chemical liquid treatment (discharge). In conventional chemical liquid treatment systems, the number of wafers (workpieces) was calculated for each processing lot and the treatment time was calculated to achieve the optimum performance or effect of the chemical liquid based on a pre-fetched function between liquid effect and the number of wafers to be processed.

The above described arrangement may be useful in processing lots where there are no significant deviations in the chemical treatment time from the pre-fetched function. However, when there are significant differences in the treatment time between the processing lots, the treatment time will deviate significantly from the pre-fetched function and affect the accuracy of treatment time calculation, which in turn may render the subsequent processing lots to progress abnormally.

DESCRIPTION

A chemical liquid treatment apparatus includes processing chambers; a chemical liquid feeding unit configured to cyclically feed a chemical liquid into the processing chambers; and a modifying unit. The modifying unit, when using a chemical liquid in which an effect thereof varies with a chemical liquid discharge time, is configured to calculate a variation of the effect of the chemical liquid based on the chemical liquid discharge time and is configured to modify the chemical liquid discharge time for each of the processing chambers based on the calculated variation of the effect of the chemical liquid and a cumulative time of the chemical liquid discharge time.

Embodiments are described herein with reference to the accompanying drawings. Elements that are substantially identical between the embodiments are identified with identical reference symbols and are not re-described. The drawings are schematic and do not reflect the actual relation between thickness and planar dimensions as well as the ratio of thicknesses between different layers, etc.

First Embodiment

Figure 1:
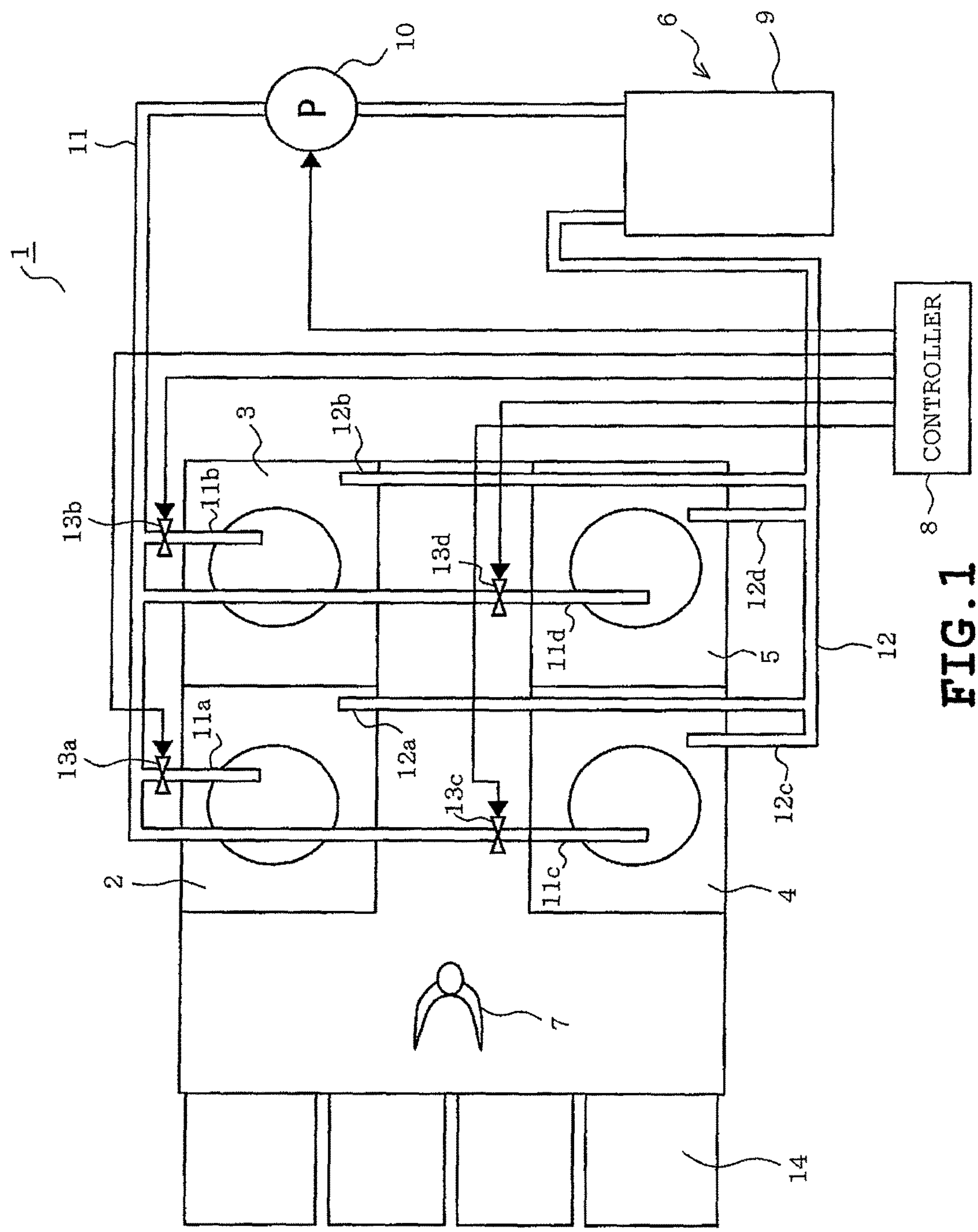
FIG. 1 is one example of a top view schematically illustrating the overall configuration of a chemical liquid treatment apparatus of a first embodiment.

FIG. 1 is a plan view schematically illustrating the overall configuration of chemical liquid treatment apparatus 1 of the first embodiment. In the first embodiment, chemical liquid treatment apparatus 1 is configured as a single wafer processing type.

Chemical liquid treatment apparatus 1 is provided with four processing chambers 2, 3, 4, and 5 for example, chemical liquid feeding unit 6, carrier robot 7, and controller (modifying unit) 8. Chemical liquid feeding unit 6 supplies a chemical liquid such as a fluoric acid to processing chambers 2, 3, 4, and 5. Carrier robot 7 carries or transfers the workpiece which is a wafer in this example. Controller 8 is responsible for the overall control of chemical liquid treatment apparatus 1.

Each of processing chambers 2, 3, 4, and 5 is a chemical liquid treatment unit configured to process a single wafer at a time. Each of processing chambers 2, 3, 4, and 5 is provided with a wafer holder, a rotary unit, one or more nozzles, and the like which are neither shown. The wafer holder holds the wafer rotatably and is rotated by the rotary unit. The nozzle discharges a cleaning liquid or a wet etchant for example onto the wafer.

Chemical liquid feeding unit 6 is provided with chemical liquid tank 9, pump 10, supply path 11, and return path 12. Chemical liquid tank 9 stores one or more types of chemical liquids. One example of such chemical liquid is a buffered fluoric acid. Pump 10 sucks out the chemical liquid from chemical liquid tank 9. Supply path 11 feeds the chemical liquid sucked out by pump 10 into processing chambers 2, 3, 4, and 5. Return path 12 returns the chemical liquid collected from processing chambers 2, 3, 4, and 5 into chemical liquid tank 9. Pump 10 is driven and controlled by controller 8.

Supply path 11 is subdivided into branches 11*a*, 11*b*, 11*c*, and 11*d* which feed the chemical liquid into processing chambers 2, 3, 4, and 5, respectively. Branches 11*a*, 11*b*, 11*c*, and 11*d* are provided with valves 13*a*, 13*b*, 13*c*, and 13*d*, respectively. Each of valves 13*a*, 13*b*, 13*c*, and 13*d* is opened/closed by controller 8. One end of each of branches 11*a*, 11*b*, 11*c*, and 11*d* is connected to the nozzle of processing chambers 2, 3, 4, and 5, respectively. Return path 12 is subdivided into branches 12*a*, 12*b*, 12*c*, and 12*d* which collect the chemical liquid from processing chambers 2, 3, 4, and 5, respectively. In the above described structure, the chemical liquid within chemical liquid tank 9 is fed into processing chambers 2, 3, 4, and 5 by pump 10 by way of supply path 11. Then, the chemical liquid used in the processing of processing chambers 2, 3, 4, and 5 are collected by way of return path 12 and returned to chemical liquid tank 9. The circulation of the chemical liquid is repeated thereafter.

Carrier robot 7 is driven and controlled by controller 8. Carrier robot 7 is capable of unloading the wafer from load port 14 and carrying the wafer onto the wafer holders of processing chambers 2, 3, 4, and 5 as well as unloading the wafer from the wafer holders of processing chambers 2, 3, 4, and 5 and carrying the wafer to load port 14. Further, carrier robot 7 is capable of: unloading the wafer from the wafer holder of first processing chamber 2 and carrying the wafer to the wafer holder of second processing chamber 3; unloading the wafer from the wafer holder of second processing chamber 3 and carrying the wafer to the wafer holder of third processing chamber 4; unloading the wafer from the wafer holder of third processing chamber 4 and carrying the wafer to the wafer holder of fourth processing chamber 5.

Figure 2A:
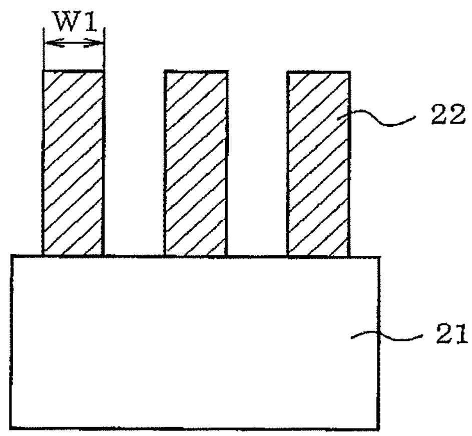
FIG. 2A is one example of vertical cross-sectional view schematically illustrating a line-and-space pattern before the chemical liquid treatment.
Figure 2B:
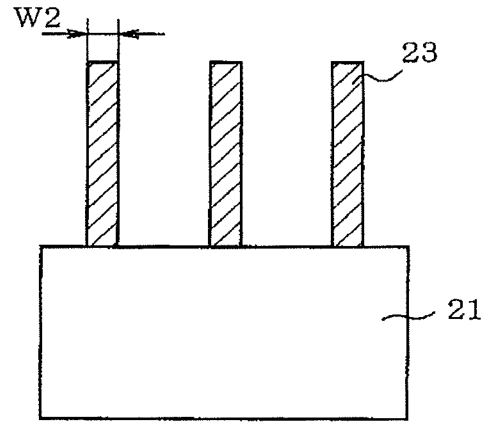
FIG. 2B is one example of vertical cross-sectional view schematically illustrating the line-and-space pattern after the chemical liquid treatment.

Next, one example of a chemical liquid treatment performed by chemical liquid treatment apparatus 1 having the above described structure is described with reference to FIGS. 2 and 3. In the first embodiment, the chemical liquid treatment is described through an example of wafer etching. FIG. 2A illustrates the pre-etch state. As illustrated, line-and-space pattern 22 is formed above lower layer film 21. FIG. 2B illustrates the post-etch state. Line-and-space pattern 22 is slimmed by etching (chemical liquid treatment) to obtain pattern 23 having the desired fine dimensions as illustrated in FIG. 2B. One example of film 21 may be a deposited silicon film. One example of line-and-space pattern 22 may be a silicon oxide film. One example of the etching liquid may be a fluoric acid or a buffered fluoric acid. Film 21 may be replaced by other types of films as long as such films are not easily etched by the chemical liquid. Line-and-space pattern 22 may be replaced by other types of films as long as such films are easily etched by the chemical liquid.

Figure 3:
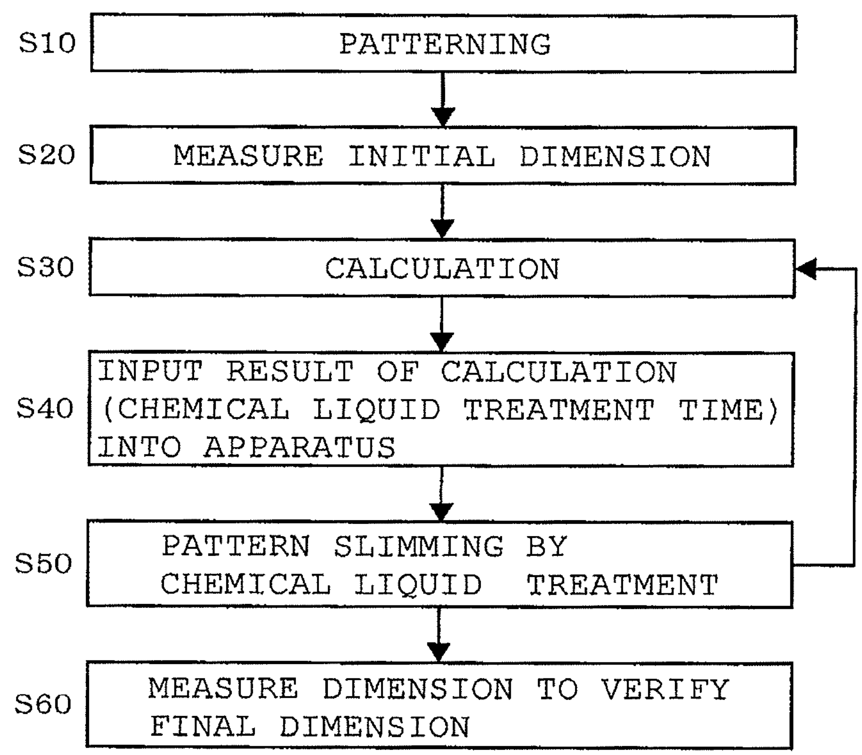
FIG. 3 is one example of a flowchart of the chemical liquid treatment.

FIGS. 3 is a simplified process flow for forming the above described pattern 23. At step S10 of FIG. 3, a resist pattern patterned for example by a resist is formed above the $SiO_2$ film. Using the resist pattern as a mask, the $SiO_2$ film is processed by dry etching for example to obtain line-and-space pattern 22 illustrated in FIG. 2A.

Then at step S20, the dimension (initial dimension) of pattern 22 processed at step S10 is measured. Then, at step S30, a calculation process is carried out based on the dimension of pattern 22 obtained at step S20 to calculate the chemical liquid treatment time (which may also be referred to as the duration of chemical liquid treatment time) required for the post-etch (post-chemical liquid treatment) pattern 23 to achieve the desired dimension.

Then, at step S40, the chemical liquid treatment time calculated at step S30 is inputted to chemical liquid treatment apparatus 1. Then, at step S50, etching is carried out by chemical liquid treatment apparatus 1 based on the chemical liquid treatment time for slimming pattern 22 and thereby obtain pattern 23. The treatment time of chemical liquid treatment carried out by chemical liquid treatment apparatus 1 is fed back to the calculation process performed at step S30 and is reflected in the calculation of the treatment time of the next chemical liquid treatment. Then, at step S60, the finished dimension of line-and-space pattern 23 illustrated in FIG. 2B is measured. The dimension obtained at step S60 may be used to calculate the etch rate of the chemical liquid, and the result of calculation may be fed back to the calculation process of step S30 to be reflected in the calculation of the treatment time of the next chemical liquid treatment.

Figure 4A:
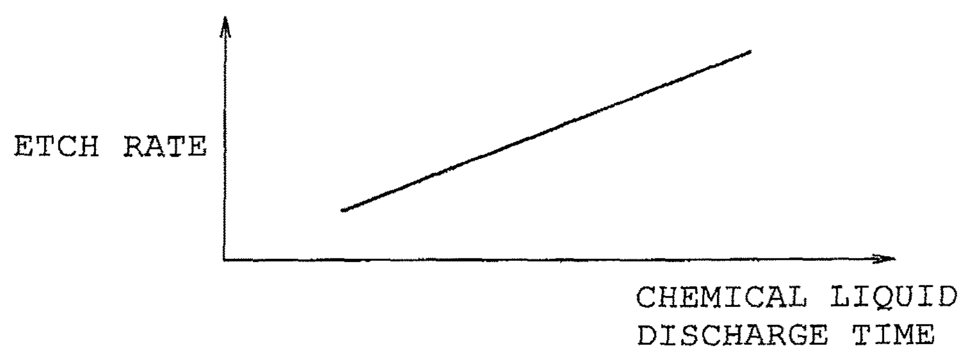
FIG. 4A is a chart indicating the relation between chemical liquid discharge time and etch rate.
Figure 4B:
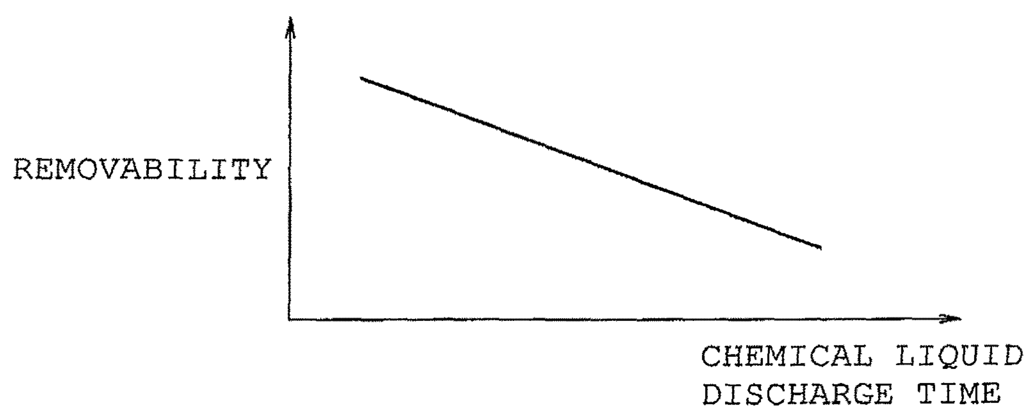
FIG. 4B is a chart indicating the relation between chemical liquid discharge time and removability.

Line-and-space pattern 23 illustrated in FIG. 2B, being formed of a silicon oxide film, is employed for example as a part of a hard mask material for dry etching or as a sacrificial layer in forming patterns of a semiconductor device such as a gate electrode, a damascene wiring, or an active region. Thus, the dimension of pattern 23 needs to be controlled with high precision. However, when a buffered fluoric acid is used for example as the chemical liquid, the etch rate of the buffered fluoric acid increases as the chemical liquid treatment time of the buffered fluoric acid, in other words, the duration of the chemical liquid discharge (chemical liquid discharge time) onto the wafer becomes longer, due to the evaporation of the ammonia in the buffered fluoric acid. The chart of FIG. 4A indicates the relation (function) between the duration of chemical liquid discharge time and the etch rate (the operation and effect of the chemical liquid) when the buffered fluoric acid is used as the chemical liquid. When an organic fluoride-based wet etchant is used for example as the chemical liquid for the removal of polymer, the relation (function) between the duration of chemical liquid discharge time and removability (the operation and effect of the chemical liquid) can be represented as the chart of FIG. 4B. The relation indicated in FIG. 4B is the opposite of the relation indicated in FIG. 4A. This is because removability of polymer is reduced as the duration of the chemical liquid discharge (chemical liquid discharge time) onto the wafer becomes longer. Thus, the relation (function) of the cumulative time of chemical liquid treatment and the operation and effect of the chemical liquid needs to be taken into consideration when calculating the chemical liquid treatment time (chemical liquid discharge time) at step S30 of FIG. 3 as will be later described in detail.

Figure 5:
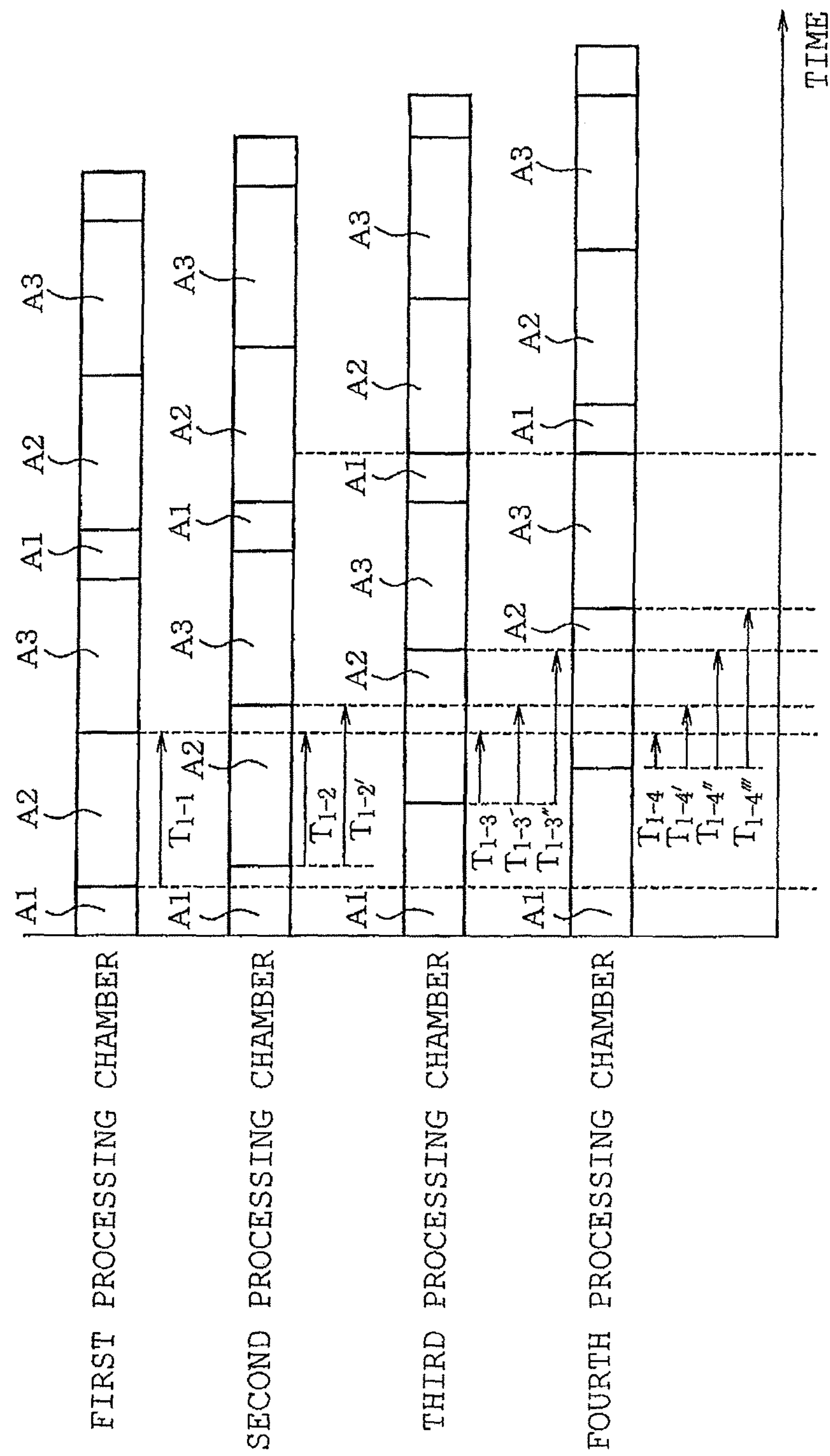
FIG. 5 is a chart illustrating the chemical liquid treatment sequence in chronological order.

Referring now to FIG. 5, a description will be given on one example of a sequence of a chemical liquid treatment carried out by chemical liquid treatment apparatus 1 illustrated in FIG. 1. The chart of FIG. 5 indicates the sequence of the chemical liquid treatment carried out by chemical liquid treatment apparatus 1 in chronological order. The workpiece (wafer) processing carried out in first processing chamber 2 of chemical liquid treatment apparatus 1 is configured by transfer process A1, chemical liquid treatment A2, and rinse-and-dry process A3. When the workpiece is transferred in the order of first processing chamber 2, second processing chamber 3, third processing chamber 4, and fourth processing chamber 5, the timing of chemical liquid discharge will be delayed in each of processing chambers 3, 4, and 5.

In FIG. 5, the duration of chemical liquid treatment A2 in first processing chamber 2 is represented by T1-1.

The time period from the start of chemical liquid treatment A2 in second processing chamber 3 to the end of chemical liquid treatment A2 in first processing chamber 2 is represented by T1-2. The duration of chemical liquid treatment A2 in second processing chamber 3 is represented by T1-2'.

The time period from the start of chemical liquid treatment A2 in third processing chamber 4 to the end of chemical liquid treatment A2 in first processing chamber 2 is represented by T1-3. The time period from the start of chemical liquid treatment A2 in third processing chamber 4 to the end of chemical liquid treatment A2 in second processing chamber 3 is represented by T1-3'. The duration of chemical liquid treatment A2 in third processing chamber 4 is represented by T1-3".

The time period from the start of chemical liquid treatment A2 in fourth processing chamber 5 to the end of chemical liquid treatment A2 in first processing chamber 2 is represented by T1-4. The time period from the start of chemical liquid treatment A2 in fourth processing chamber 5 to the end of chemical liquid treatment A2 in second processing chamber 3 is represented by T1-4'. The time period from the start of chemical liquid treatment A2 in fourth processing chamber 5 to the end of chemical liquid treatment A2 in third processing chamber 4 is represented by T1-4". The duration of chemical liquid treatment A2 in fourth processing chamber 5 is represented by T1-4'".

Thus, cumulative time t1 of chemical liquid discharge time expended on the treatment of the workpiece in first processing chamber 2 is obtained by the equation:

$$t1=(T1\text{-}1)+(T1\text{-}2)+(T1\text{-}3)+(T1\text{-}4).$$

Cumulative time t2 of chemical liquid discharge time expended on the treatment of the workpiece in second processing chamber 3 is obtained by the equation:

$$t2=(T1\text{-}1)+(T1\text{-}2')+(T1\text{-}3')+(T1\text{-}4').$$

Cumulative time t3 of chemical liquid discharge time expended on the treatment of the workpiece in third processing chamber 4 is obtained by the equation:

$$t3=(T1\text{-}1)+(T1\text{-}2')+(T1\text{-}3'')+(T1\text{-}4'').$$

Cumulative time t4 of chemical liquid discharge time expended on the treatment of the workpiece in fourth processing chamber 5 is obtained by the equation:

$$t4=(T1\text{-}1)+(T1\text{-}2')+(T1\text{-}3'')+(T1\text{-}4''').$$

Figure 6:
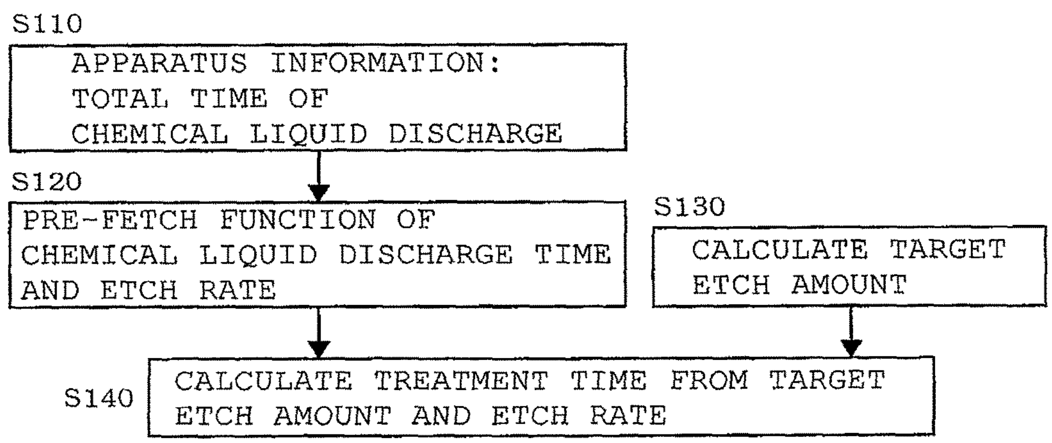
FIG. 6 is a flowchart of a calculation process.

Referring now to FIG. 6, a description will be given on one example of the calculation process of step S30 in FIG. 3 which may be described as a high-precision dimension control. First, at step S110 of FIG. 6, cumulative time (total discharge time) of chemical liquid discharge time is fetched as information pertaining to chemical liquid treatment apparatus 1. Then, at step S120, the function representing the relation (property) between chemical liquid discharge time (cumulative time thereof) and the etch rate as indicated in FIG. 4A is pre-fetched. At step S130, which may be executed in parallel with steps S110 and 120, the etch amount of the etch target (the workpiece, i.e., pattern 22 of wafer) is fetched. The etch amount may be obtained by subtracting width W2 of pattern 23 indicated in FIG. 2B from width W1 of pattern 22 indicated in FIG. 2A. The calculation process of step S130 is executed at step S20 of FIG. 3.

Next, one example of the process for fetching the cumulative chemical liquid discharge time at step S110 will be described in detail. The cumulative chemical liquid discharge time can be calculated from the process sequence indicated in FIG. 5. As indicated in FIG. 5, cumulative time t1 of chemical liquid discharge time at the end of the chemical liquid treatment of the workpiece in first processing chamber 2 is also inclusive of the sum or the accumulation of chemical liquid discharge time in each of other processing chambers 3, 4, and 5 at end of the chemical liquid treatment of the workpiece in first processing chamber 2. That is, the above described cumulative time t1 of chemical liquid discharge time can be represented as t1=(T1-1)+(T1-2)+(T1-3)+(T1-4). Similarly, cumulative time t2 of chemical liquid discharge time of the workpiece in second processing chamber 3 can be represented as t2=(T1-1)+(T1-2')+(T1-3')+(T1-4').

The calculation method discussed above is applied to a chemical liquid treatment apparatus provided with multiple processing chambers in which chemical liquid treatment is carried out in parallel by supplying one or more types of chemical liquids to each of the processing chambers. The number of types of the chemical liquids is less than the number of processing chambers. The chemical liquid is circulated within the chemical liquid treatment apparatus.

Figure 7:
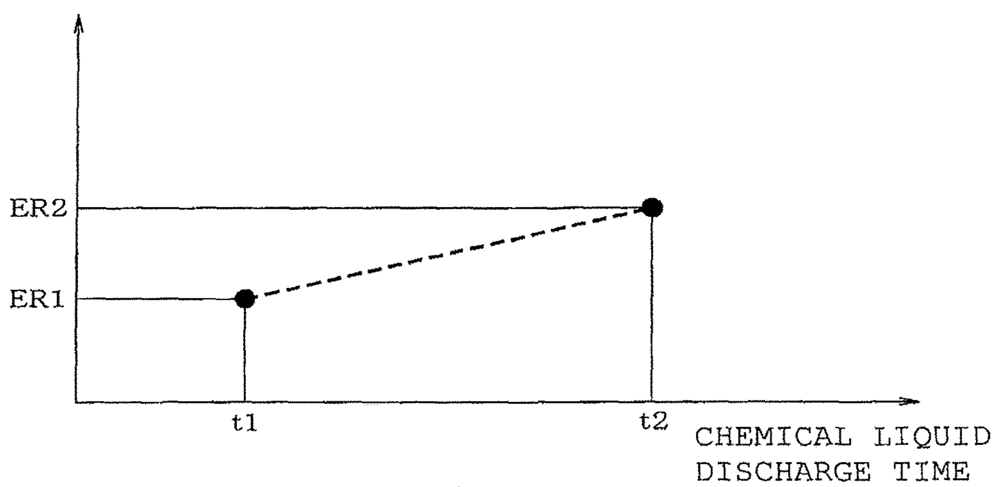
FIG. 7 is a chart indicating the relation between chemical liquid discharge time and etch rate.

Referring next to FIG. 7, a description will be given on how the function between the chemical liquid discharging time (cumulative time thereof) and the etch rate is derived. In FIG. 7, the etch rate of the workpiece in first processing chamber 2 is represented by ER1, and the etch rate of the workpiece in second processing chamber 3 is represented by ER2, the cumulative chemical liquid discharge time (total chemical liquid discharge time) in first processing chamber 2 is represented as t1, and the cumulative chemical liquid discharge time in second processing chamber 3 is represented as t2. The broken line in the chart of FIG. 7 gives the function between the cumulative chemical liquid discharge time and the etch rate which indicates the effect of the chemical liquid. Two or more plots representing the relation between the cumulative chemical liquid discharge time of the workpiece and the etch rate may be taken in deriving the function. The etch rate is calculated approximately based on the difference between the pre-etch dimension and the post-etch dimension of the workpiece and the chemical liquid discharge time. Because the etch rate varies with the cumulative chemical liquid discharge time, the cumulative chemical liquid discharge time is used as a parameter in determining the etch rate.

Figure 8:
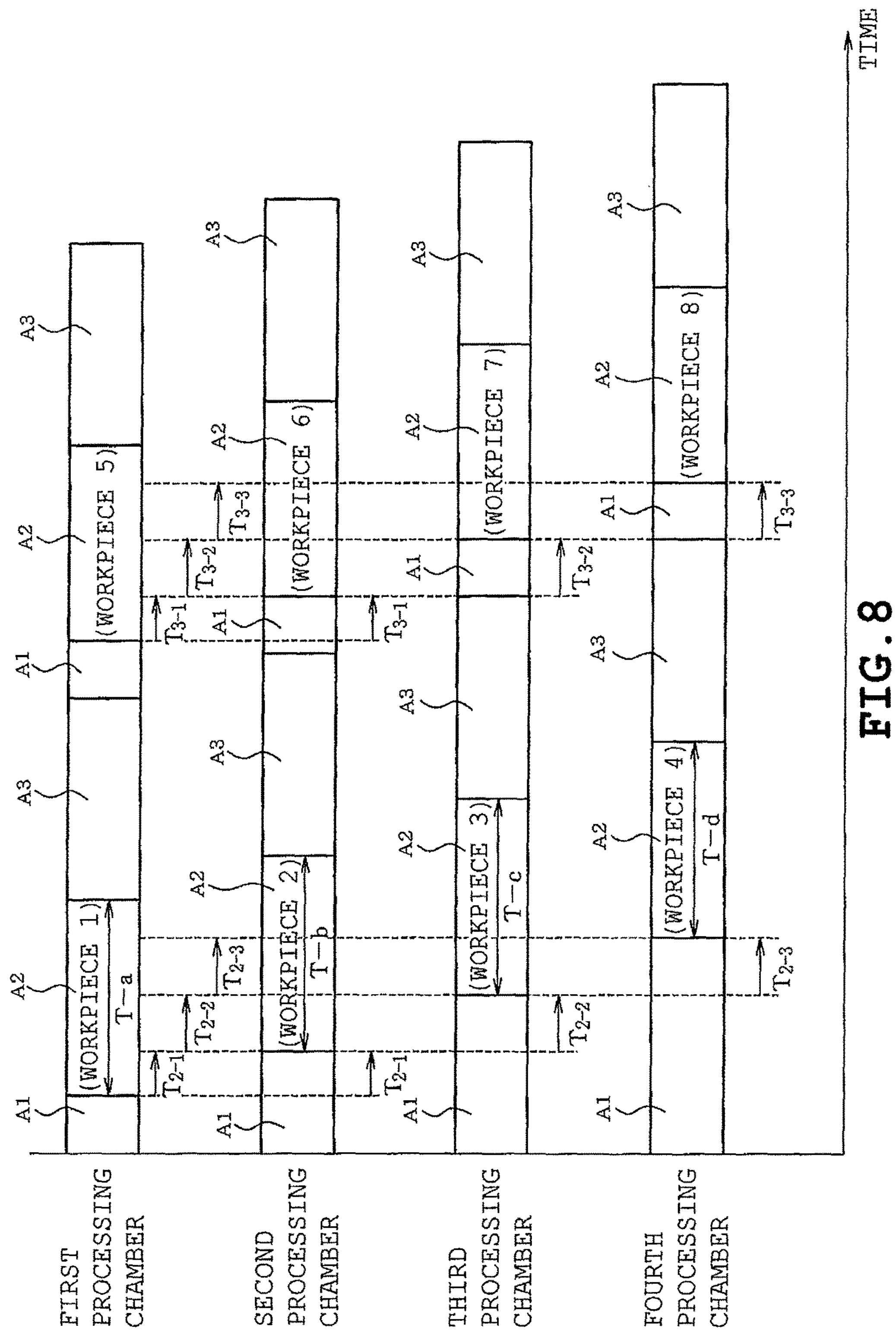
FIG. 8 is a diagram for explaining the calculation method of cumulative time of chemical liquid discharge time.

At step S140 of FIG. 6, the chemical liquid treatment time is calculated based on the target etch amount obtained at step S130 and the function between the cumulative chemical liquid discharge time and the etch rate. The calculation process for obtaining the chemical liquid treatment time will be described with reference to FIG. 8. Referring to FIG. 8, assuming that chemical liquid treatment A2 of workpiece 1 in first processing chamber 2 is the initial state, the cumulative chemical liquid discharge time at the start of chemical liquid discharge for workpiece 2 in second processing chamber 2 is T2-1. This is because the chemical liquid has already been discharged in first processing chamber 2 for time T2-1 while the transfer of workpiece 2 into second processing chamber 3 is delayed by time T2-1. Similarly, the cumulative chemical liquid discharge time at the start of chemical liquid discharge for workpiece 3 in third processing chamber 4 is (T2-1+T2-2)+T2-2 which is the sum of the chemical liquid discharge time in first processing chamber 2 and second processing chamber 3. Further, the cumulative chemical liquid discharge time at the start of chemical liquid discharge for workpiece 4 in fourth processing chamber 5 is (T2-1+T2-2+T2-3)+(T2-2+T2-3)+T2-3 which is the sum of the chemical liquid discharge time in first processing chamber 2, second processing chamber 3, and third processing chamber 4.

At this instance, the treatment time expended on the chemical liquid treatment of workpiece 1 in first processing chamber 2 is represented as T-a; the treatment time expended on the chemical liquid treatment of workpiece 2 in second processing chamber 3 is represented as T-b; the treatment time expended on the chemical liquid treatment of workpiece 3 in third processing chamber 4 is represented as T-c; and the treatment time expended on the chemical liquid treatment of workpiece 4 in fourth processing chamber 5 is represented as T-d. Accordingly, the cumulative chemical liquid discharge time at the start of chemical liquid discharge for workpiece 5 in first processing chamber 2 can be represented by (T-a)+(T-b)+(T-c)+(T-d). The cumulative chemical liquid discharge time at the start of chemical liquid discharge for workpiece 6 in second processing chamber 3 can be represented by (T-a)+(T-b)+(T-c)+(T-d)+(T3-1). The cumulative chemical liquid discharge time at the start of chemical liquid discharge for workpiece 7 in third processing chamber 4 can be represented by (T-a)+(T-b)+(T-c)+(T-d)+(T3-1)+(T3-2)+(T3-2). The cumulative chemical liquid discharge time at the start of chemical liquid discharge for workpiece 8 in fourth processing chamber 5 can be represented by (T-a)+(T-b)+(T-c)+(T-d)+(T3-1)+(T3-2)+(T3-3)+(T3-2)+(T3-3)+(T3-3).

Figure 9:
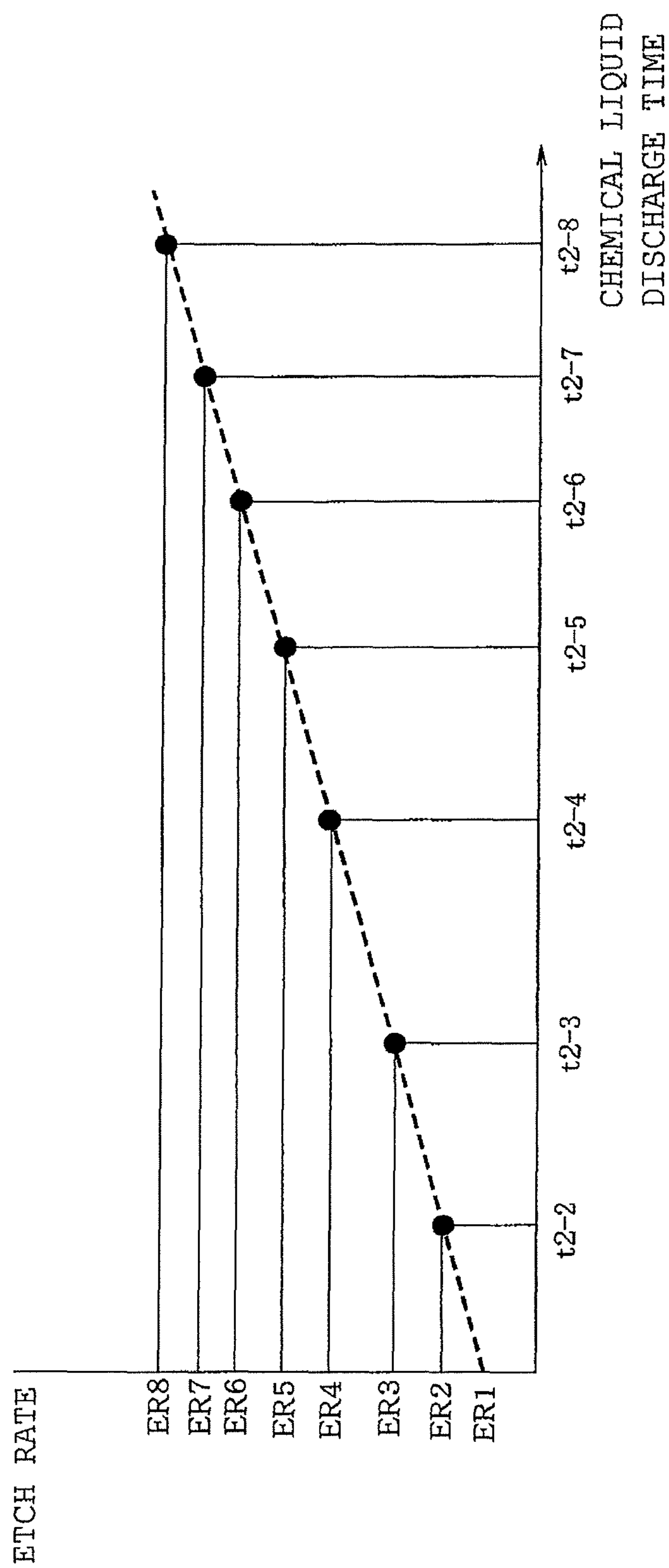
FIG. 9 is a chart indicating the relation between chemical liquid discharge time and etch rate.

FIG. 9 is a property chart indicating the relation (function) between the chemical liquid discharge time (cumulative time thereof) and the etch rate. Etch rates ER1, ER2, . . . , ER8 corresponding to the chemical liquid discharge time T2-2, T2-3, . . . , T2-8 are indicated in FIG. 9. The chemical liquid discharge time T2-2, T2-3, . . . , T2-8 may be expressed as follows.

T2-2=T2-1

T2-3=(T2-1)+(T2-2)+(T2-2)

T2-4=(T2-1)+(T2-2)+(T2-3)+(T2-2)+(T2-3)+(T2-3)

T2-5=(T-a)+(T-b)+(T-c)+(T-d)

T2-6=(T-a)+(T-b)+(T-c)+(T-d)+(T3-1)

T2-7=(T-a)+(T-b)+(T-c)+(T-d)+(T3-1)+(T3-2)+(T3-2)

T2-8=(T-a)+(T-b)+(T-c)+(T-d)+(T3-1)+(T3-2)+(T3-3)+(T3-2)+(T3-3)+(T3-3)

Then, the chemical liquid treatment time is calculated based on etch rate ERx obtained from the aforementioned FIG. 9 and the target etch amount calculated in step S130 of FIG. 6. The calculated chemical liquid treatment time for the workpiece is fed back to chemical liquid treatment apparatus 1 (refer to step S40 of FIG. 3). The chemical liquid treatment time is calculated by the following equation (1).

chemical liquid treatment time (sec)=etch amount (nm)/ERx(nm/sec)   (1).

The calculation of the chemical liquid discharge time by equation (1) may be carried out in real time based on the information of the chemical liquid discharge time for each of the processing chambers 2, 3, 4, and 5 or in advance in consideration of the process sequence.

In the first embodiment described above, it is possible to precisely specify the chemical liquid discharge time when slimming line-and-space pattern 22 illustrated in FIG. 2A by chemical liquid etching. Thus, it is possible to improve patterning precision, in other words, the precision of the dimension of the finished line-and-space pattern 23 illustrated in FIG. 2B formed by the chemical liquid treatment.

Second Embodiment

Figure 10:
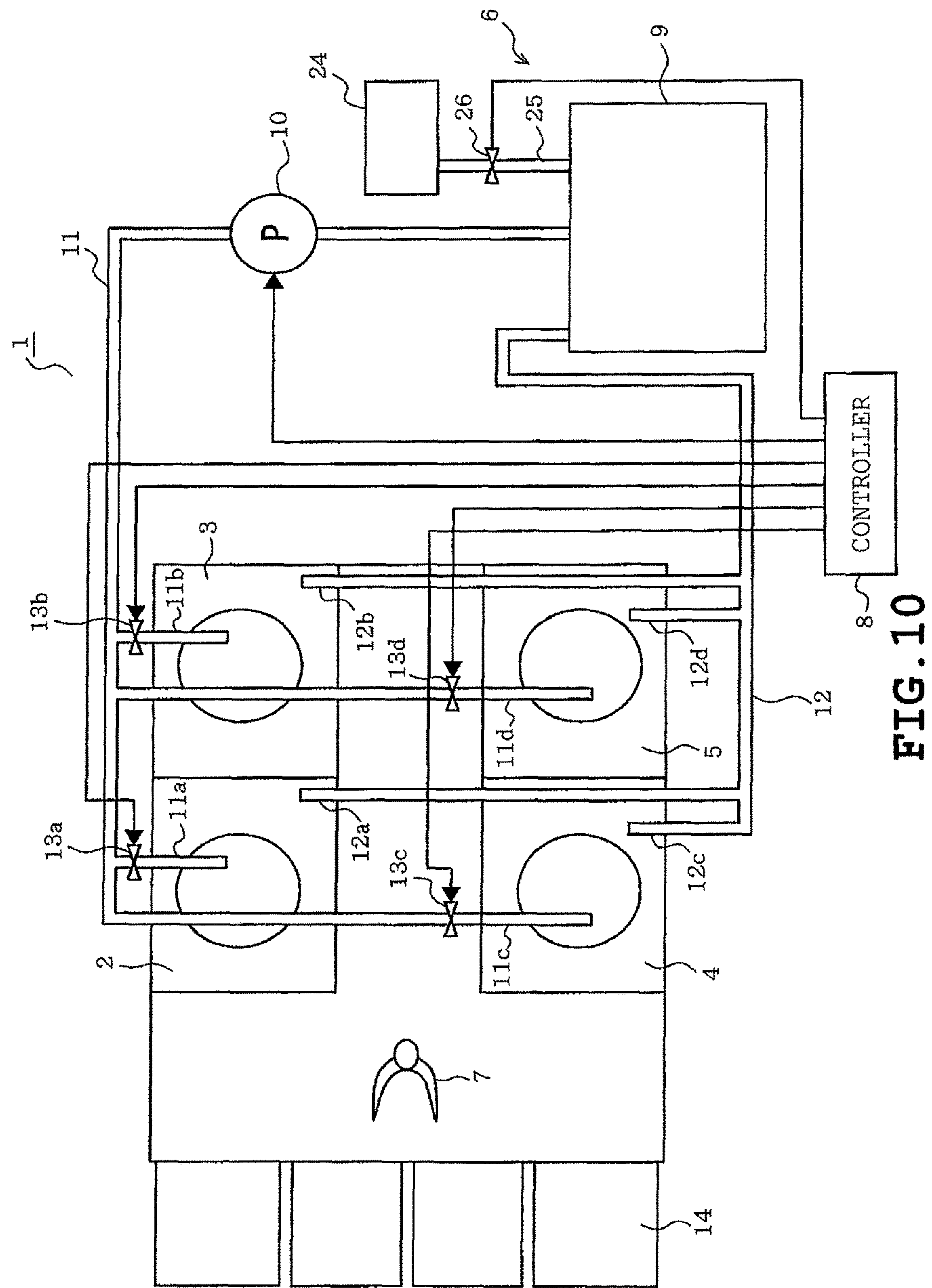
FIG. 10 illustrates a second embodiment and corresponds to FIG. 1.
Figure 11:
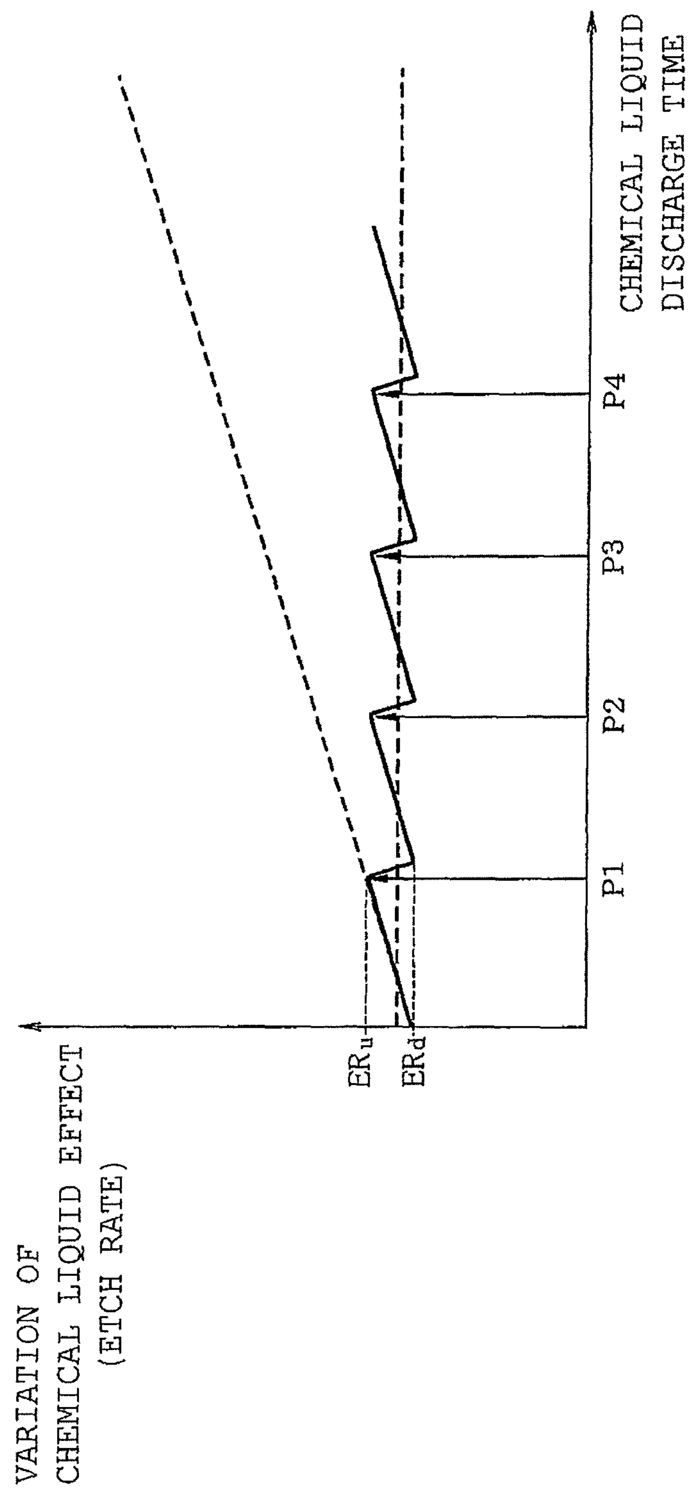
FIG. 11 corresponds to FIG. 9.

FIGS. 10 and 11 illustrate a second embodiment. Elements that are identical to those of the first embodiment are identified with identical reference symbols. In the second embodiment, a second chemical liquid (a replenishing chemical liquid) is replenished so that the variation in the effect of the chemical liquid does not exceed a certain amount in the chemical liquid treatment apparatus in which the effect of the chemical liquid varies with the duration of the chemical liquid discharge.

More specifically, chemical liquid treatment apparatus 1 is provided with second chemical liquid tank (replenishing chemical liquid tank) 24, chemical liquid supply path (replenishing chemical liquid supply path) 25, and valve (replenishing valve) 26 as illustrated in FIG. 10. Second chemical liquid tank 24 stores a second chemical liquid, one example of which may be aqueous ammonia or ammonia water. Chemical liquid supply path (replenishing chemical liquid supply path) 25 feeds the second chemical liquid to chemical liquid tank 9 from second chemical liquid tank 24. Valve 26 is provided at chemical liquid supply path 25. Opening/closing of valve 26 is controlled by controller 8. Second chemical liquid tank 24, chemical liquid supply path 25, and valve 26 serve as a chemical liquid replenishing unit.

In the above described structure, controller 8 opens valve 26 to feed a specified amount of the second chemical liquid to chemical liquid tank 9 from second chemical liquid tank 24 when the etch rate (effect of the chemical liquid) has reached the upper limit ERu at time (chemical liquid discharge time) P1 as illustrated in FIG. 11. As a result, the etch rate is reduced to lower limit ERd. Controller 8 closes valve 26 once the specified amount of the second chemical liquid is fed to chemical liquid tank 9 from second chemical liquid tank 24. Then, controller 8 opens valve 26 at time P2, P3, P4, . . . in which the etch rate reaches upper limit ERu to feed the specified amount of the second chemical liquid from second chemical liquid tank 24 to chemical liquid tank 9. As a result, the etch rate of the chemical liquid varies between lower limit ERd and upper limit ERu as illustrated in FIG. 11. In summary, in the second embodiment, the variation in the etch rate of the chemical liquid is confined within a specified range. Further, in the second embodiment, a control to modify the chemical liquid discharge time is carried out while the variation of the etch rate of the chemical liquid is observed as was the case in the first embodiment.

Other than the differences described above, the second embodiment is substantially the same as the first embodiment. Thus, the operation and effect substantially identical to those of the first embodiment can be obtained in the second embodiment as well. Especially in the second embodiment, variation in the etch rate of the chemical liquid is confined within a specified range. Thus, it is possible to reduce the magnitude of the modification of the chemical liquid discharge time and thereby improve the patterning precision of the chemical liquid treatment even more effectively.

Other Embodiments

The embodiments described above may be modified as follows.

The buffered fluoric acid used as the chemical liquid possessing an etching effect may be replaced by a chemical liquid possessing a cleaning effect such as a particle removing effect. Examples of such cleaning liquids include SC1 (ammonia hydrogen peroxide solution), SC2 (hydrochloric hydrogen peroxide solution), choline hydrogen peroxide solution, hydrochloric ozone water, SPM (sulfuric peroxide mixture), or the like generally used in semiconductor cleaning. In the foregoing embodiments, one type of chemical liquid was fed into the multiple processing chambers. Alternatively, a mixture of multiple types of chemical liquids may be fed into the processing chambers. Further, the embodiments were described through a chemical liquid treatment system in which the effect of the chemical liquid was a linear function of the chemical liquid discharge time. Alternatively the effect of the chemical liquid may be a polynomial function of the chemical liquid discharge time.

In the second embodiment, one type of chemical liquid (ammonia water) was used as the second chemical liquid. Alternatively, multiple types of chemical liquids, or a mixture of multiple types of chemical liquids may be used. A pump may be provided between chemical liquid supply path 25 connecting second chemical liquid tank 24 and chemical liquid tank 9 of the second embodiment. Further, a stirring unit for stirring the chemical liquid may be provided in chemical liquid tank 9 in the second embodiment.

Chemical liquid treatment apparatus 1 of the foregoing embodiments allow improvement in the patterning precision of the chemical liquid treatment since the duration of workpiece processing can be calculated precisely based on cumulative time of chemical liquid treatment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A chemical liquid treatment apparatus comprising:

processing chambers;

a chemical liquid feeder configured to cyclically feed a chemical liquid into the processing chambers;

a controller, when using a chemical liquid in which an effect thereof varies with a chemical liquid discharge time, being configured to calculate a variation of the effect of the chemical liquid based on the chemical liquid discharge time and being configured to modify the chemical liquid discharge time for each of the processing chambers based on the calculated variation of the effect of the chemical liquid and a cumulative time of the chemical liquid discharge time;

a chemical valve configured to replenish the chemical liquid with a replenishing chemical liquid for recovering the effect of the chemical liquid;

wherein the cumulative time of the chemical liquid discharge time is a sum of a time of chemical liquid discharge for each of the processing chambers obtained by measuring the time of chemical liquid discharge in each of the processing chambers;

wherein the chemical liquid feeder includes a chemical liquid tank configured to store the chemical liquid, a pump configured to suck out the chemical liquid from the chemical liquid tank, a supply path configured to feed the chemical liquid sucked out of the pump into the processing chambers, and a return path configured to return the chemical liquid collected from the processing chambers to the chemical liquid tank;

wherein the variation in the effect of the chemical liquid is kept within a predetermined variation range by replenishing the chemical liquid with the replenishing chemical liquid provided from the chemical valve;

wherein the chemical valve includes a replenishing chemical liquid tank configured to store the replenishing chemical liquid, a replenishing chemical liquid supply path configured to feed the replenishing chemical liquid from the replenishing chemical liquid tank to the chemical liquid tank, and a valve provided to the replenishing chemical liquid supply path;

wherein the valve is configured to open/close to provide a predetermined amount of the replenishing chemical liquid from the replenishing chemical liquid tank to the chemical liquid tank when the effect of the chemical liquid has reached an upper limit;

wherein a chemical liquid supply time for the workpiece to be subjected to a next chemical liquid treatment is changed according to the variation over time in the effect of the supplied chemical liquid in etching the workpiece and the cumulative chemical liquid discharge time in the processing chambers;

wherein the controller configured to calculate a chemical liquid treatment time based on an etch amount of a workpiece and a function representing a relation between the cumulative time of the chemical liquid discharge time and an etch rate;

wherein the function representing the relation between the cumulative time of the chemical liquid discharge time and the etch rate is obtained and stored in advance by the controller;

wherein an amount of chemical liquid corresponding to modified chemical liquid treatment time is fed to the workpiece in the processing chambers by the chemical liquid feeder; and wherein each of the processing chambers configured to process the workpiece by feeding the chemical liquid to the workpiece.

2. The apparatus according to claim 1, wherein the chemical liquid feeder is configured to be capable of feeding one type of chemical liquid or a mixture of two or more types of chemical liquids.

3. The apparatus according to claim 1, wherein the replenishing chemical liquid supply path includes a pump.

4. The apparatus according to claim 1, wherein the chemical liquid comprises a buffered fluoric acid and the replenishing chemical liquid comprises an aqueous ammonia.

* * * * *